United States Patent
Wortham et al.

(10) Patent No.: US 9,052,368 B2
(45) Date of Patent: Jun. 9, 2015

(54) NEGATIVE PEAK VOLTAGE DETECTION FOR ENHANCED FUELGAUGE EMPTY VOLTAGE PREDICTION

(75) Inventors: Jason Allen Wortham, Fremont, CA (US); Joseph Brian Vanden Wymelenberg, Los Altos, CA (US); Kin Keung Lau, Redwood City, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 588 days.

(21) Appl. No.: 13/316,158

(22) Filed: Dec. 9, 2011

(65) Prior Publication Data

US 2012/0153960 A1 Jun. 21, 2012

Related U.S. Application Data

(60) Provisional application No. 61/423,514, filed on Dec. 15, 2010.

(51) Int. Cl.
 *H02J 7/00* (2006.01)
 *G01N 27/416* (2006.01)
 *G01R 31/36* (2006.01)

(52) U.S. Cl.
 CPC .......... *G01R 31/361* (2013.01); *G01R 31/3651* (2013.01)

(58) Field of Classification Search
 USPC .................................................. 324/426, 433
 See application file for complete search history.

(56) References Cited

U.S. PATENT DOCUMENTS

| | | | | |
|---|---|---|---|---|
| 4,126,037 A | * | 11/1978 | Hanson et al. | 73/114.23 |
| 5,598,086 A | * | 1/1997 | Somerville | 320/148 |
| 2005/0208368 A1 | * | 9/2005 | Nakamura et al. | 429/49 |
| 2008/0053715 A1 | * | 3/2008 | Suzuki et al. | 180/2.1 |
| 2009/0182517 A1 | * | 7/2009 | Gandhi et al. | 702/58 |
| 2009/0322340 A1 | * | 12/2009 | Zhang et al. | 324/433 |
| 2011/0309838 A1 | * | 12/2011 | Lin et al. | 324/427 |
| 2011/0316548 A1 | * | 12/2011 | Ghantous et al. | 324/427 |

OTHER PUBLICATIONS

"Low-Cost I2C Battery Monitor", *Dallas Semiconductor, DS2745 Data Sheet*, (Sep. 14, 2005), pp. 1-14.
"MAX17040/MAX17041 Compact, Low-Cost 1S/2S Fuel Gauges", Maxim Integrated Products, Inc., Sunnyvale, California, (Aug. 2011), pp. 1-13.
"MAX17043/MAX17044 Compact, Low-Cost 1S/2S Fuel Gauges with Low-Battery Alert", Maxim Integrated Products, Inc., Sunnyvale, California, (Aug. 2011), pp. 1-14.
(Continued)

*Primary Examiner* — Richard Isla Rodas
*Assistant Examiner* — David V Henze-Gongola
(74) *Attorney, Agent, or Firm* — Blakely Sokoloff Taylor & Zafman LLP

(57) ABSTRACT

Negative peak voltage detection for battery end of life estimations in fuel gauging is disclosed. Battery powered devices such cell phones and laptop computers create some noise in the form of negative excursions from the average output voltage of the battery which can cause the battery powered device to stop functioning. By negative peak detection relative to the average battery voltage, the end of life or discharged voltage condition can be altered in response to the negative peaks to obtain the maximum battery life without risk of the device inadvertently shutting down. Average output voltage of the battery may be taken as an estimated open circuit voltage or some other battery voltage. Various embodiments are disclosed.

27 Claims, 2 Drawing Sheets

(56) References Cited

OTHER PUBLICATIONS

"MAX17047 ModelGauge m3 Fuel Gauge", Maxim Integrated Products, Inc., Sunnyvale, California, (Sep. 2011), pp. 1-46.
"MAX17048/MAX17049 Micropower 1-Cell/2-Cell Li+ ModelGauge ICs", Maxim Integrated Products, Inc., Sunnyvale, California, (Feb. 2012), pp. 1-19.
"MAX17058/MAX17059 1-Cell/2-Cell Li+ ModelGauge ICs", Maxim Integrated Products, Inc., Sunnyvale, California, (Feb. 2012), pp. 1-16.
"Stand-Alone Fuel Gauge IC", *Dallas Semiconductor, DS2780 Data Sheet*, (Dec. 9, 2004), pp. 1-27.
"Stand-Alone Fuel Gauge IC", *Dallas Semiconductor, DS2782 Data Sheet*, (Apr. 25, 2005), pp. 1-25.

\* cited by examiner

NEGATIVE PEAK VOLTAGE DETECTION FOR ENHANCED FUELGAUGE EMPTY VOLTAGE PREDICTION

CROSS-REFERENCE TO RELATED APPLICATIONS

This application claims the benefit of U.S. Provisional Patent Application No. 61/423,514 filed Dec. 15, 2010.

BACKGROUND OF THE INVENTION

1. Field of the Invention

The present invention relates to battery fuel gauges for indicating the state of charge of a rechargeable battery.

2. Prior Art

As used herein, the word battery will be used generally, and is to be understood to include multiple batteries and battery packs, that is, multiple cells or batteries packaged and electrically connected to functionally appear as a single battery of a higher voltage and/or higher current capacity.

In many rechargeable battery powered devices, it is desirable to know the state of charge (or discharge) of the battery during its discharge cycle so that the user of the battery powered device can appropriately time the recharging of the battery, and when necessary, limit the use of the battery powered device to more essential uses to preserve power before the next recharging of the battery. One way this is done in the prior art is to use battery fuel gauges, generally referred to as Coulomb counters, which monitor the current provided to and taken from the battery, which for a battery of a given amp-hour rating, can be used to predict what fraction of the amp-hour rating remains in the battery throughout its discharge cycle. Such devices are readily commercially available, such as by way of example, the DS2745, the DS2782 and DS2780 fuel gauges manufactured and sold by Maxim Integrated Products of Sunnyvale, Calif., assignee of the present invention.

Such devices are useful for the intended purpose, though have certain characteristics that are less than ideal. By way of example, one undesirable characteristic of Coulomb counters is the fact that they essentially operate as integrators, and as such, their output at any time is subject to an accumulation of integration errors since the last time they were set to a reference, typically by fully charging or fully discharging the battery. Accordingly, such battery fuel gauges can work satisfactorily when a battery is regularly fully charged, or alternatively, fully discharged, to provide the reference, but do not perform well if the battery is repeatedly only partially charged and partially discharged. Also their accuracy declines with battery age, as they generally do not account for decline in battery capacity with battery age. This has the very undesirable effect of indicating some battery charge left when the battery is about empty, so to speak.

Another approach to obtaining an indication of the state of charge of rechargeable batteries is to simply monitor the terminal voltage of the battery and to provide a warning to the user when the terminal voltage begins to approach the voltage at which the battery powered device will automatically shut down. This, of course, has the advantage of simplicity and avoidance of the requirement of a current sense resistor in series with the battery, though has the disadvantage of not providing an ongoing indication of the state of charge of the battery because of not considering the load on the battery at the time of the indication, nor the nonlinearity of state of charge and battery terminal voltage under any conditions.

In that regard, many battery operated devices do not present a constant current drain to the battery, but rather present what can be considered an average load with a ripple voltage thereon, depending on what capability of the battery powered device is in use (mode of operation) at that particular time, and the battery impedance. That ripple voltage may cause the battery voltage to momentarily drop below the minimum system operating voltage, causing the system to shut down. This problem may be accounted for by setting the empty battery voltage at a higher voltage to account for the highest ripple to be encountered assuming worst case conditions, but that penalizes the battery life when the device is operating in a mode with a lower ripple, or worst case conditions are not encountered. Preferably some reserve power will be provided if the empty battery voltage can be accurately determined to allow background functions (saving data, shutting down, maintaining clock), error budgeting (no fuel-gauge can be perfect) and to protect the battery from overdischarge.

Maxim Integrated Products, assignee of the present invention, manufactures and sells voltage-based battery fuel gauges that model the battery itself, and track the state of charge of the battery independent of the current load, if any, on the battery. In particular, an ideal battery of a given amp-hour capacity would provide a constant voltage output until outputting its total amp-hour capacity, after which the battery voltage would fall to zero. Real batteries, however, exhibit a decrease in terminal voltage with a decreasing state of charge and/or an increasing current load (due to the internal battery impedance). Some batteries have a terminal voltage that falls off rapidly as the fully discharged state is approached. Some types of batteries, when fully charged, have a higher terminal voltage which decreases fairly quickly during an initial discharge, though generally commonly used rechargeable batteries, except for these "end" conditions, have an open terminal voltage versus state of charge that is somewhat linear (but declining) over most of the battery discharge cycle.

One battery model that can be used in a fuel gauge is a simple RC network, where R represents the internal impedance of the battery and C represents the equivalent capacitance of the battery for any given open circuit battery voltage. R can be easily determined by loading and unloading the battery, and to the first order, generally can be taken as a constant value. The apparent capacitance C in the simple RC model at any point in the open circuit voltage versus state of charge curve is equal to the inverse of the rate of change of the open circuit voltage of the battery per amp-hour of current withdrawn. Consequently one may plot the equivalent capacitance of the battery versus open circuit voltage, and the plot of capacitance versus battery open circuit voltage can then be approximated as piecewise constant C values over various increments of the open circuit voltage. Of course R and C may be scaled as desired without effecting the result. Then on charging and discharging, using the RC model and sensing the battery terminal voltage and current to and from the battery, the open circuit voltage of the battery can be calculated to determine the state of charge of the battery independent of the current flow. Of course one can also use a more complicated battery model to account for such things as long term recovery of the battery (a long time constant component), temperature, variations in battery impedance (R), current, etc. Also a Coulomb counter can be used with such modeling, the Coulomb counter increasing the transient and short term accuracy of the modeling and the modeling increasing the long term accuracy of the Coulomb counter.

Such a fuel gauge is illustrated in FIG. 1. In this Figure, R1 is the current sense resistor for the Coulomb counter, and R2 is a scaled equivalent for the battery voltage model (i.e. effectively modeling the battery and R1). SOC(Min) is the battery voltage that is to be considered as an empty battery, SOC (Max) is the battery voltage that is to be considered a full or fully charged battery, and SOC is the present state of charge, usually as some fraction of the state of charge between the full and empty conditions.

DETAILED DESCRIPTION OF THE PREFERRED EMBODIMENTS

The present invention is applicable to cell phones as well as many other rechargeable battery powered devices, such as computers, cameras, tablets, etc. Accordingly, for purposes of specificity, cell phones shall be used as an exemplary application, though it is to be understood that the present invention is not by any means so limited.

Cell phones normally don't utilize the full battery capacity because the ripple voltage (generally associated with the wireless transmitter) causes some uncertainty about when the phone will not have enough voltage to sustain a phone call or internet usage. By having a high bandwidth visibility on the ripple, one can provide much better predictions about runtime until low (empty) voltage.

Figure 2:
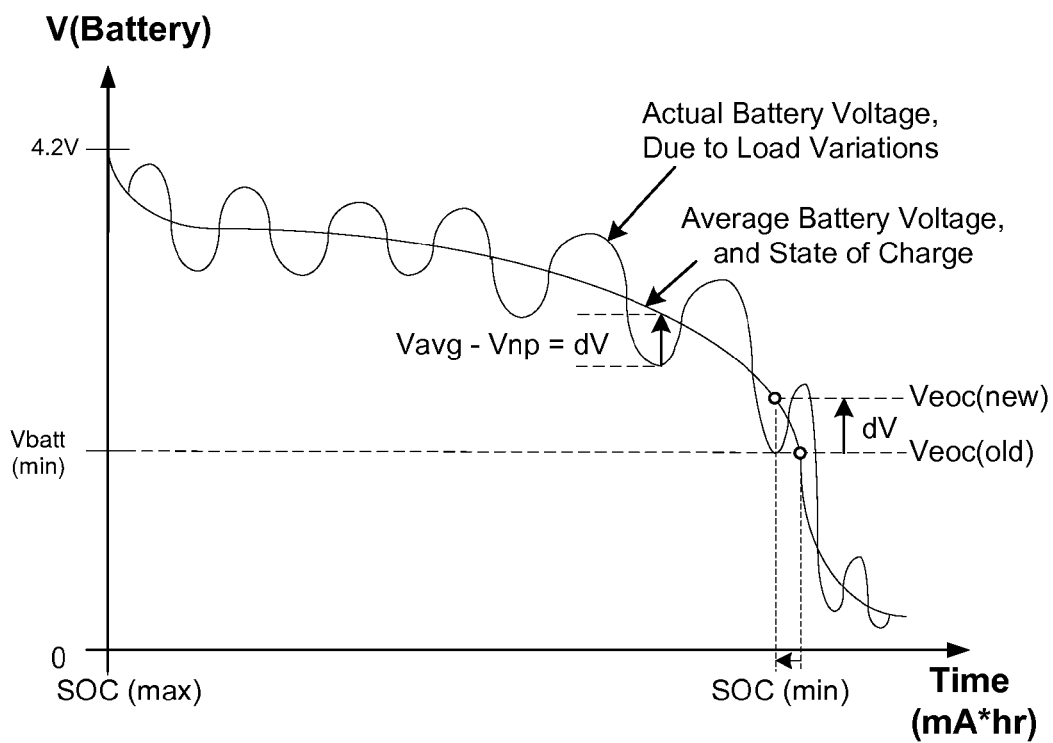
FIG. 2 is a schematic illustration of what is called an average battery voltage versus state of charge and the actual battery voltage due to load variations.

The concept of the present invention is schematically illustrated in FIG. 2. Illustrated therein are what is called an average battery voltage and the actual battery voltage due to load variations versus a state of charge. This Figure is highly schematic, in that the typical ripple voltage on the average battery voltage will be of a much higher frequency for any given operating mode of the battery operated device, though well illustrates the principles of the present invention. In particular, it may be seen in FIG. 2 that the negative excursion dV of the battery ripple voltage from the average battery voltage results in the momentary actual battery voltage reaching the minimum battery voltage Vbatt(min) at a higher state of charge than the average battery voltage would reach the minimum battery voltage Vbatt(min). Accordingly it may be seen that for a given mode of operation of the battery operated device, maximum battery life will be achieved without the battery operated device inadvertently failing to operate and shut down properly, or prematurely shut down, by tracking the negative peaks of the battery voltage due to load variation and determining the minimum battery voltage Vbatt(min) to shut down the system when those negative peaks reach that minimum battery voltage. Further, the state of charge indicated by any fuel gauge during use of the device (as the battery discharges) should be adjusted accordingly so that not only will shut down occur at the proper time, but the indicator of state of charge will read accurately during the entire discharge cycle, at least for the mode of operation the device is currently in.

Figure 1:
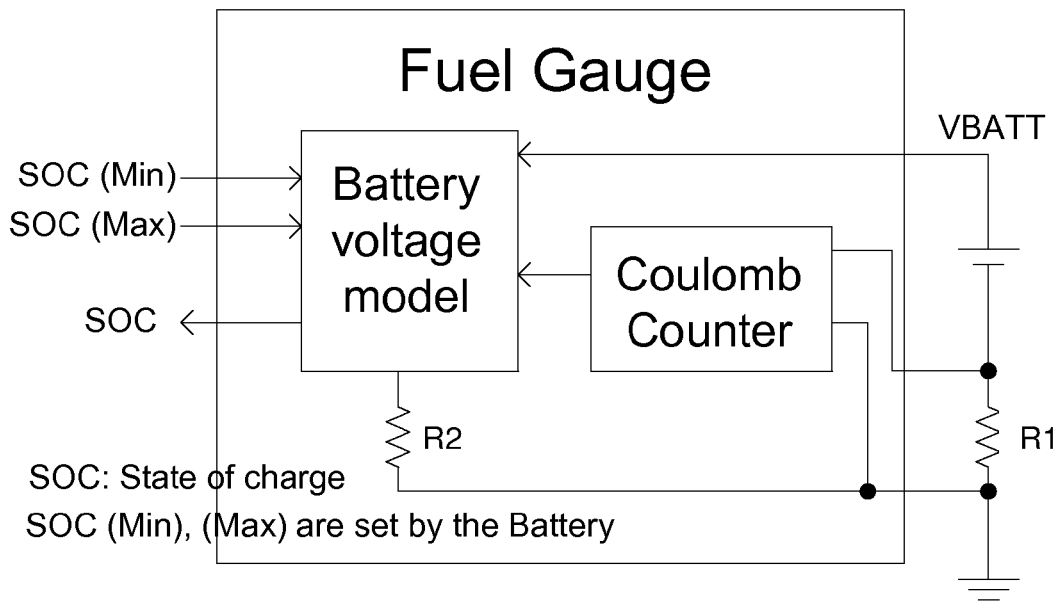
FIG. 1 is a block diagram of a prior art fuel gauge.
Figure 3:
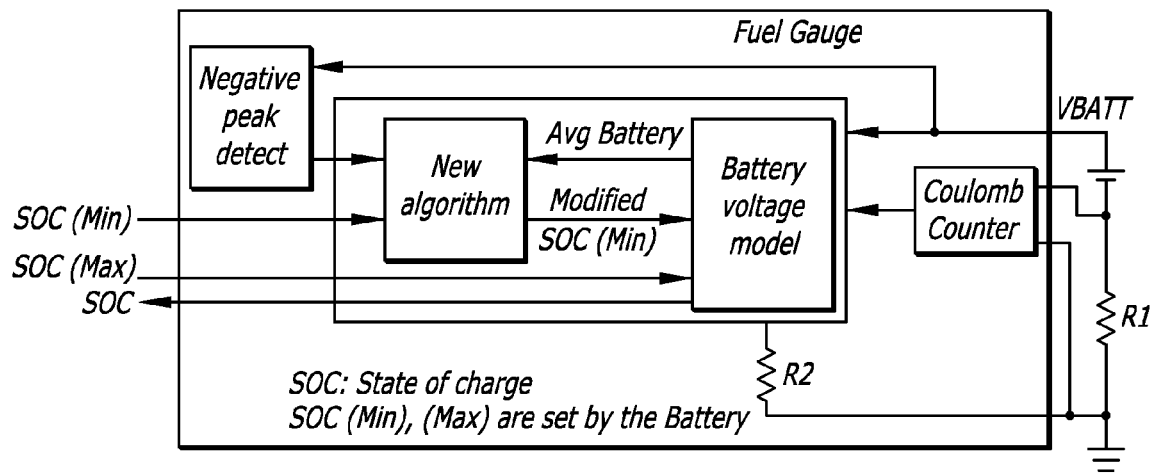
FIG. 3 is a block diagram of a fuel gauge in accordance with one embodiment of the present invention.

Now referring to FIG. 3, a fuel gauge of the general type of FIG. 1, modified in accordance with FIG. 2, may be seen. In particular, the fuel gauge of FIG. 3 is the same as that of FIG. 1, though with the addition of a negative peak detect block and a New Algorithm for receiving the negative peak signal and providing a modified SOC (min) signal to the battery voltage model. The fuel gauge of FIG. 3 still receives as inputs the minimum (available) state of charge SOC(min) representing an empty battery, a maximum state of charge SOC(Max) representing a fully charged battery, and a state of charge output SOC. However the minimum (available) state of charge SOC(Min) goes to the New Algorithm, which together with the negative peak detect provides a modified minimum (available) state of charge SOC(Min) to the battery voltage model. In its simplest form, the New Algorithm may simply be to add the deviation of the minimum peak dV to the state of charge minimum (available) SOC(min) to provide the modified SOC(Min) to the battery voltage model. In turn, the battery voltage model, having the newly defined empty voltage, can now determine the state of charge at any state of discharge. More typically the New Algorithm may add some fraction (smaller or larger than 1) to the negative peak dV, as any correction for the ripple voltage is better than no correction. Also there may be some negative spikes in the ripple voltage which are too short to trigger a shutdown of the system, which can effectively be discounted by reducing dV by some factor less than 1 in providing the modified state of charge SOC(Min) modified.

Note that the particular battery voltage model used is a matter of choice, as is the inclusion of the Coulomb counter, though whatever basic fuel gauge mechanism is used, the inclusion of the negative peak of the ripple voltage as described provides a more accurate determination of the minimum battery voltage Vbatt (min) than not accounting for the ripple voltage. Further, even if only a Coulomb counter is used as the fuel gauge, knowledge of the general shape of the battery voltage with state of charge would allow the inclusion of the negative peak ripple voltage to determine the negative adjustment in the battery ampere hour capacity to reach the system shutdown voltage Vbatt(min). Such a system, however, is not preferred, in part because of the inherent limitations of Coulomb counters alone, and in part because of the need in such a system to still compound a number of worst case possibilities to unnecessarily truncate the battery capacity in most actual devices, even using a measured negative peak dV.

Figure 4:
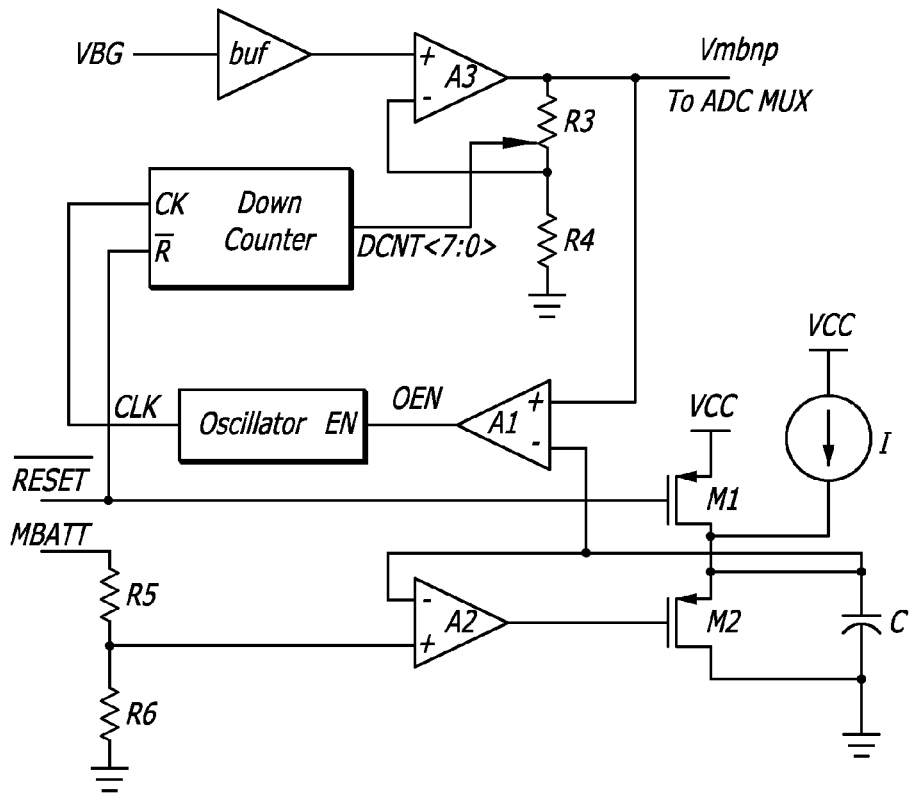
FIG. 4 is a diagram of one embodiment of negative peak detector that may be used in the present invention.

Now referring to FIG. 4, a diagram of a negative peak detector used in one embodiment may be seen. The peak detector is a combination of an analog and digital peak detector. In particular, the analog portion actually senses the negative peak and the digital portion digitizes and holds the negative peak in digital form for processing. The negative peak voltage is held in digital dV form (FIG. 2) unless or until a later occurring more negative peak voltage dV is encountered at which time the digital output is updated, or held until the circuit is reset. When the circuit is reset by $\overline{\text{RESET}}$ going low, the down counter is reset to its highest count, setting R3, which is variable resistance ladder, at its highest resistance so that amplifier A3 provides the highest gain to the bandgap voltage VBG as buffered by buffer buf. Accordingly, the output Vmbnp (Voltage main battery negative peak) provided to an analog to digital converter MUX will momentarily be at its highest output, which normally will be chosen to be that the voltage of a fully charged battery or higher.

Also on reset when $\overline{\text{RESET}}$ goes low, transistor M1 is turned on, charging capacitor C to the supply voltage VCC. Then when $\overline{\text{RESET}}$ goes high again, transistor M1 is turned off. The main battery voltage MBATT, preferably the terminal voltage of the battery (not including the sense resistor R1 of FIG. 3) is divided down by resistor divider R5 and R6 and provided to the positive input of amplifier A2. The negative input to amplifier A2 is the voltage on the capacitor C which will be higher than the voltage on the positive input of amplifier A2, turning on transistor M2 until the voltage on the capacitor C decreases to match the voltage MBATT as divided down. This voltage is applied to the negative input of amplifier A1 which has its positive output connected to the output voltage Vmbnp. Since Vmbnp is at its highest value right after reset, the positive input to amplifier A1 will be greater than the negative input, enabling the oscillator which proceeds to clock the down counter, in one embodiment at 250 kHz) to decrease the resistance of resistor R3. This provides greater feedback to the amplifier A3, reducing the output voltage Vmbnp until the positive input of amplifier A1 drops below the voltage of the negative input of the amplifier to disable the oscillator, after which the down counter maintains the count to provide a fixed output voltage Vmbnp proportional to count and thus proportional to the negative peak encountered on the input voltage MBATT. Current source I is provided to keep the voltage on capacitor C from further drifting downward. In that regard the voltage on capacitor C may drift upward between negative peaks on MBATT as may be limited by the feedback to amplifier A2 and the control of transistor M2, though on the next negative peak if greater (lower in voltage) than the prior negative peak, that new negative peak will be sensed on capacitor C, driving the negative input of amplifier A1 negative compared to the positive input, enabling the oscillator until the down counter counts down to again match the output Vmbnp with that greater negative peak. Thus the Oscillator and the Down Counter are active only when a larger negative peak compared to the then average battery voltage is encountered, resulting in an accurate, infinitely persistent until reset, but very low power negative peak detector.

In use, since the circuit of FIG. 4 senses the negative peak voltage, and the New Algorithm of FIG. 3 in the exemplary embodiment compares the average battery voltage with the negative peak voltage to determine dV (FIG. 2) to provide a modified minimum (available) state of charge SOC(min) to the battery voltage model, it is intended to sense the shorter term excursions of the battery voltage, not the battery discharging from a prolonged load. Thus the negative peak voltage will preferably be detected with a fixed or substantially fixed average battery voltage (FIG. 2). Accordingly, in one embodiment the circuit of FIG. 4, the circuit may be reset approximately every 250 ms, by way of example, with the prior value of dV being held as part of the New Algorithm until such time as a greater value of dV is encountered, after which the prior value will be updated by that later greater value of dV (greater negative peak). Note however, that a longer time between resets could be used, as each negative peak is compared against the average battery voltage at that time, so the circuit itself takes into account the incremental discharge of the battery during the time between resets.

Accordingly, by using the present invention, the useful life of a battery (time between recharges) can be significantly increased by adjusting the minimum (available) state of charge in a particular battery powered device based on the actual operating characteristics of that device and battery rather than by compounding worse case scenarios, i.e., assuming for every device that the negative peaks will be at the maximum for the worst device still considered operative, having the weakest battery with the highest internal impedance at its greatest accumulation of age and abuse for an operative battery, etc.

In one embodiment, the average battery voltage (FIGS. 2 and 3) is taken as the open circuit voltage as determined by the battery voltage model (FIG. 3). Accordingly, since the negative peak detector in the embodiment disclosed senses the absolute negative peak, that negative peak may be compared against any characteristic voltage of the battery to provide the modified minimum (available) state of charge (Modified SOC (Min) based on actual battery characteristics. Also in multi-function devices, such as iPhones, various functions provide different loads to the battery with different negative peak voltages thereon. Accordingly one could use the present invention to sense and store the maximum negative peak voltages for each of multiple functions so that the state of charge can be displayed in terms of the percentage of time that the currently operating function will remain operative before the battery will be considered empty. Thus in such an implementation, when transmitting as a cell phone, the fuel gauge of the present invention may indicate that the battery is approaching empty because of the high transmit power requirement, whereas if the operation is changed to that of a calculator for example, a higher state of charge would be indicated, not because the battery suddenly really has a higher state of charge (as would be indicated by the open circuit voltage of the battery) but because the dV of the negative peaks from the open circuit voltage would be much smaller, allowing the open circuit voltage to decrease substantially more before the much lower negative peaks from the open circuit voltage would create an empty battery condition. The stored negative peaks may be reset, for example, on each battery recharge, or perhaps after multiple recharges, as desired, though should at least occasionally be reset so as to better track an aging battery.

The present invention works well when used as part of a fuel gauge based on a battery voltage model, particularly with a Coulomb counter. However the invention is not so limited. In particular, battery operated devices typically provide some form of warning or shutdown of the device when the device thinks it is approaching an empty battery condition. Whatever technique is used for this purpose may be enhanced by the present invention by substituting a real world measurement of negative peak voltages caused by the device in place of conservative estimations which are in most cases too conservative to take full advantage of the actual battery capacity and operating characteristics of the particular device in question.

The present invention has been described herein with respect to determining the negative peaks or negative peak ripple in battery voltage (preferably the terminal voltage of the battery) and modifying the available state of charge of the battery based thereon. The circuitry for doing this may take any of various forms, such as by use of a high speed analog-to-digital converter or an AC coupling circuit to a peak detector. One could also determine the total ripple in the battery terminal voltage and use that to modify the predetermined available state of charge based on the largest negative peak in the battery voltage relative to the average battery voltage by estimating the largest negative peak from the total ripple.

Thus the present invention has a number of aspects, which aspects may be practiced alone or in various combinations or sub-combinations, as desired. While certain preferred embodiments of the present invention have been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. A method of estimating the end of life of a battery in a battery powered device comprising:

estimating an average battery voltage during a discharge cycle of the battery;

determining the negative peaks in the battery voltage relative to the estimated average battery voltage during operation of the battery powered device and storing a largest negative peak in the battery voltage relative to the estimated average battery voltage;

modifying the estimated average battery voltage based on the largest negative peak in the battery voltage relative to the estimated average battery voltage; and estimating the battery end of life based on the modified estimated average battery voltage.

2. The method of claim 1 wherein the estimated average battery voltage is an estimated open circuit voltage of the battery.

3. The method of claim 2 wherein the estimated open circuit battery voltage is estimated using a battery voltage model.

4. The method of claim 3 wherein the battery voltage model is an RC battery voltage model.

5. The method of claim 3 wherein the battery voltage model includes a coulomb counter.

6. The method of claim 1 wherein the determining of the negative peaks in the battery voltage relative to the estimated average battery voltage during operation of the battery powered device and storing a largest negative peak in the battery voltage relative to the estimated average battery voltage is done repeatedly, each over a time period during which the change in the estimated average battery voltage due to discharge of the battery is less than the negative peaks being stored.

7. The method of claim 1 wherein the sensing the negative peaks in the estimated average battery voltage during operation of the battery powered device is done using an oscillator, a counter coupled to an output of the oscillator and a variable resistance controlled by the counter, the variable resistance controlling a circuit providing an output responsive to the negative peaks as stored as a count in the counter, the sensing being done by repeatedly resetting the counter, and enabling the oscillator whenever, between resets, a negative peak exceeds an already stored negative peak, to cause the counter to count until the counter output corresponds to the new negative peak in battery voltage.

8. The method of claim 1 wherein the battery voltage model receives as inputs, a voltage responsive to battery voltage and an input from a coulomb counter.

9. The method of clam 1 wherein modifying the estimated average battery voltage is based on the largest negative peak in the battery voltage relative to the estimated average battery voltage comprises subtracting the largest negative peak in the battery voltage relative to the estimated average battery voltage from the estimated average battery voltage.

10. The method of clam 1 wherein modifying the estimated average battery voltage is based on the largest negative peak in the battery voltage relative to the estimated average battery voltage comprises subtracting a fraction of the largest negative peak in the battery voltage relative to the estimated average battery voltage.

11. The method of claim 1 wherein the battery powered device has a plurality of operating modes, and wherein the method is practiced separately for each operating mode.

12. A method of estimating the end of life of a battery in a battery powered device comprising:

estimating an average battery voltage during a discharge cycle of the battery;

determining the ripple in the battery voltage relative to the estimated average battery voltage during operation of the battery powered device and storing a largest ripple in the battery voltage relative to the estimated average battery voltage;

modifying the estimated average battery voltage based on the ripple in the battery voltage relative to the estimated average battery voltage; and estimating the battery end of life based on the modified estimated average battery voltage.

13. The method of claim 12 wherein the estimated average battery voltage is an estimated open circuit voltage of the battery.

14. The method of claim 13 wherein the estimated open circuit battery voltage is estimated using a battery voltage model.

15. The method of claim 14 wherein the battery voltage model is an RC battery voltage model.

16. The method of claim 14 wherein the battery voltage model includes a coulomb counter.

17. The method of claim 12 wherein the battery voltage model receives as inputs, a voltage responsive to battery voltage and an input from a coulomb counter.

18. The method of clam 12 wherein modifying the estimated average battery voltage is based on the largest ripple in the battery voltage relative to the estimated average battery voltage comprises subtracting the largest ripple in the battery voltage relative to the estimated average battery voltage from the estimated average battery voltage.

19. The method of clam 12 wherein modifying the estimated average battery voltage is based on the largest ripple in the battery voltage relative to the estimated average battery voltage comprises subtracting a fraction of the largest ripple in the battery voltage relative to the estimated average battery voltage.

20. The method of claim 12 wherein the battery powered device has a plurality of operating modes, and wherein the method is practiced separately for each operating mode.

21. A method of estimating the end of life of a battery in a battery powered device comprising:

estimating a state of charge of the battery by estimating an open circuit voltage of the battery during a discharge cycle using an RC battery voltage model;

sensing negative peaks in the battery voltage relative to the estimated open circuit voltage of the battery during the discharge cycle of the battery and storing a largest negative peak in the battery voltage relative to the open circuit voltage of the battery;

modifying the estimated state of charge of the battery by subtracting a fraction of the largest negative peak in the battery voltage from the estimated open circuit voltage of the battery and determining the modified state of charge of the battery to estimate the end of life of the battery.

22. The method of claim 21 wherein the sensing of the negative peaks in the battery voltage relative to the estimated open circuit voltage of the battery during the discharge cycle of the battery and storing a largest negative peak in the battery voltage relative to the estimated state of charge of the battery is done repeatedly, each over a time period during which the change in the open circuit voltage due to discharge of the battery is less than the negative peaks being stored.

23. The method of claim 21 wherein the sensing the negative peaks in the battery voltage during operation of the battery powered device is done using an oscillator, a counter coupled to an output of the oscillator and a variable resistance controlled by the counter, the variable resistance controlling a circuit providing an output responsive to the negative peaks as stored as a count in the counter, the sensing being done by repeatedly resetting the counter, and enabling the oscillator whenever, between resets, a negative peak exceeds an already stored negative peak, to cause the counter to count until the counter output corresponds to the new negative peak in battery voltage.

24. The method of claim 21 wherein the battery voltage model receives as inputs, a voltage responsive to battery voltage and an input from a coulomb counter.

25. The method of clam 21 wherein modifying the estimated state of charge of the battery based on the largest negative peak in the battery voltage relative to the average battery voltage comprises subtracting the largest negative peak in the battery voltage from the average battery voltage from the average battery voltage.

26. The method of clam 1 wherein modifying the estimated state of charge of the battery based on the largest negative peak in the battery voltage relative to the average battery voltage comprises subtracting a fraction of the largest negative peak in the battery voltage from the average battery voltage.

27. The method of claim 1 wherein the battery powered device has a plurality of operating modes, and wherein the method is practiced separately for each operating mode.

\* \* \* \* \*